US005834879A

United States Patent [19]

Watanabe et al.

[11] Patent Number: 5,834,879

[45] Date of Patent: Nov. 10, 1998

[54] STACKED PIEZOELECTRIC ACTUATOR

[75] Inventors: Chiharu Watanabe, Fujimi; Takashi Enomoto, Higashi-Matsuyama, both of Japan

[73] Assignee: WAC Data Services Co., Ltd., Fujimi, Japan

[21] Appl. No.: 774,779

[22] Filed: Dec. 30, 1996

[30] Foreign Application Priority Data

| | | | |
|---|---|---|---|
| Jan. 11, 1996 | [JP] | Japan | 8-19265 |
| Jan. 11, 1996 | [JP] | Japan | 8-19266 |
| Jan. 11, 1996 | [JP] | Japan | 8-19267 |
| Jan. 11, 1996 | [JP] | Japan | 8-19268 |

[51] Int. Cl.[6] .......... H01L 41/08

[52] U.S. Cl. .......... 310/328; 310/330

[58] Field of Search .......... 310/328, 359, 310/330

[56] References Cited

U.S. PATENT DOCUMENTS

| | | | |
|---|---|---|---|
| 4,490,772 | 12/1984 | Blickstein | 361/281 |
| 4,633,120 | 12/1986 | Sato et al. | 310/328 |
| 4,754,441 | 6/1988 | Butler | 367/157 |
| 4,780,639 | 10/1988 | Shirasu | 310/328 |
| 4,814,659 | 3/1989 | Sawada | 310/328 |
| 5,089,739 | 2/1992 | Takahashi et al. | 310/328 |
| 5,168,189 | 12/1992 | Dam et al. | 310/328 |
| 5,259,099 | 11/1993 | Banno et al. | 310/359 |
| 5,266,862 | 11/1993 | Ohya | 310/328 |
| 5,367,500 | 11/1994 | Ng | 310/328 |
| 5,512,796 | 4/1996 | Paton | 310/358 |
| 5,638,822 | 6/1997 | Seyed-Bolorforosh et al. | 310/320 |

FOREIGN PATENT DOCUMENTS

| | | | |
|---|---|---|---|
| 52-35994 | 3/1977 | Japan | 310/328 |
| 59-32182 | 2/1984 | Japan | 310/332 |
| 60-178677 | 9/1985 | Japan | 310/332 |
| 713618 | 8/1954 | United Kingdom | 310/332 |

*Primary Examiner*—Thomas M. Dougherty
*Attorney, Agent, or Firm*—Nikaido, Marmelstein, Murray & Oram LLP

[57] ABSTRACT

Disclosed is a stacked piezoelectric actuator displaceable by bending comprising a plurality of piezoelectric ceramic layers stacked on one surface of a core material, and a plurality of piezoelectric ceramic layers stacked on the other surface thereof, said piezoelectric ceramic layers stacked on both surfaces being successively increased in piezoelectric constant $d_{31}$ inner layers to outer layers. The piezoelectric coefficient $d_{31}$ is derived from the following equation (2):

$$d_{31} = \kappa_{31}\sqrt{\epsilon_{33}^{T} \cdot s_{11}^{E}} \quad (2)$$

wherein k is the electromechanical coupling coefficient, the length vibration of a rectangular plate is taken as $k_{31}$, and the unit of the piezoelectric coefficient $d_{31}$ is C/N (m/V). The piezoelectric coefficient $d_{33}$ in the longitudinal vibration of a column determined by the following equation (3) is a value for the whole stacked layers, and in the present invention, it is necessary that the piezoelectric coefficient $d_{31}$ for each of the stacked piezoelectric ceramic layers satisfies the above-mentioned equation.

$$d_{33} = \kappa_{33}\sqrt{\epsilon_{33}^{T} \cdot s_{33}^{E}} \quad (3)$$

wherein k is the electromechanical coupling coefficient, and the longitudinal vibration of a column is taken as $k_{33}$.

8 Claims, 8 Drawing Sheets

21
34
20
38
34
22
30
31
310
21
34
20
38
22
34
30
31
310

STACKED PIEZOELECTRIC ACTUATOR

FIELD OF THE INVENTION

The present invention relates to a stacked piezoelectric actuator which is displaceable by bending, and more particularly to a piezoelectric actuator which can be suitably used in a textile machine, especially in a needle driving mechanism of a hosiery machine (a needle selecting arrangement for a knitting machine) or in a warp controlling mechanism of a loom.

BACKGROUND OF THE INVENTION

Previously, application of mechanical energy (force) such as pressure or tension to piezoelectric substances (crystals) such as lead zirconate ($PbZrO_3$), lead titanate ($PbTiO_3$), barium titanate ($BaTiO_3$) and barium phosphate has been known to cause static electricity (charge) to appear on a surface of each of the crystals to electrically separate it into the plus side and the minus side (polarization or electrification). The polarization or electrification phenomenon due to such mechanical strain is called a piezoelectric direct effect, and conversely, the phenomenon that deformation takes place on application of voltage is called a piezoelectric reverse effect. In this case, the force acting on the crystals varies depending on the polarity of voltage applied.

For the relationship between a direction of polarization and that of force, when the direction of polarization is the same as that of force (they are on the same axis), it is called a piezoelectric longitudinal effect, and when the direction of polarization is at right angles to that of force, it is called a piezoelectric transverse effect.

Products utilizing piezoelectric ceramics as described above have been widely used in a wide range of fields, and piezoelectric actuators utilizing displacement or force generated by the piezoelectric phenomena as mechanical driving sources have excellent features such as reduced power consumption, rapid response speed, increased displacement, decreased heat generation and reduced size and weight, compared with conventional electromagnetic actuators in which coils are wound around magnetic bodies.

As converting elements for converting electric energy and mechanical energy to each other in the piezoelectric actuators, there are mainly bimorph elements and stacked elements.

The bimorph element 3 generally comprises, for example, a metal shim member 1 and two piezoelectric ceramic plates 2 different from each other in the properties of expansion and contraction, said plates 2 being adhered to the shim member 1 with an adhesive, as shown in FIG. 7(A). On application of voltage to the bimorph element 3 through electrodes (not shown in the drawing), one of the piezoelectric plates 2 is expanded and the other is contracted to cause displacement by bending as a whole, as shown in FIG. 7(A). The arrow indicated by reference numeral 4 shows the direction of polarization. The bimorph element has the advantage that displacement is increased, whereas it has the disadvantages that there are problems with hysteresis characteristics, power of generation, mechanical strength and fatigue characteristics, and that the resonance frequency is difficult to be heightened.

On the other hand, the stacked element 5 generally comprises, for example, tens to hundreds of thin piezoelectric ceramic plates 2 stacked and fixed so that the direction of polarization 4 in the thickness direction is alternately reversed one by one, as shown in FIG. 7(B). Referring to FIG. 7(B), reference numeral 6 designates an internal electrode, and reference numeral 7 designates an external electrode. For leading of the electrodes of the stacked element 5, plus electrodes and minus electrodes are respectively connected in parallel, whereby the direction of polarization of all piezoelectric ceramic layers becomes the same as that of applied voltage to be displaced in the stacked direction. The stacked element 5 is small in displacement, but has the advantages of remarkably rapid response speed, increased power of generation, high conversion efficiency and high resonance frequency.

A stacked piezoelectric actuator 5 shown in FIG. 8(A) has a structure in which the longitudinal effect is utilized, wherein piezoelectric ceramic plates 2 provided with metal electrode films on both faces thereof and polarized in the thickness direction and metal sheets 8 are alternately stacked, and integrated by use of an adhesive. The respective metal sheets 8 are electrically connected externally by lead wires 9 for every other sheet in parallel, and electric terminals 10 are taken out. Application of voltage to the electric terminals 10 induces the movement of expansion and contraction of the actuator 5 in the height direction indicated by the arrow.

On the other hand, a stacked piezoelectric actuator 5 having a structure in which the technique of a stacked ceramic condenser called the green sheet method is used and the longitudinal effect is utilized as shown in FIG. 8(B) is also proposed.

In this actuator, a number of metal internal electrodes 11 are lamellarly embedded in piezoelectric ceramic plates 2 to integrate the internal electrodes 11 with the ceramic plates 2 without use of an adhesive. The respective internal electrodes 11 are connected for every other layer in parallel. Manufacturing methods similar to those of stacked ceramic condensers can be applied to the manufacture of the actuators having this structure, so that the manufacture thereof can be automated and they can be manufactured in large amounts and at low cost. In order to compare the stacked piezoelectric actuator 5 with the stacked ceramic condenser, a cross sectional view of the stacked ceramic condenser 12 is shown in FIG. 8(C). This comparison indicates the structural difference that the area of each internal electrode layer 11 is identical to that of the ceramic plate 2 for the stacked piezoelectric actuator 5, whereas the area of each internal electrode 13 is smaller than that of a ceramic 2 for the condenser 12. In the case of the condenser 12, unstacked portions of the upper and lower internal electrodes 13 become piezoelectrically inactive to result in sources of stress generation. When this condenser is used as an actuator, repeated application of voltage for a long period of time causes mechanical destruction thereof.

As seen from the above, ceramics are ferroelectric substances, and polarization is required to utilize their piezoelectricity. For the bimorph element 3 as described above, the polarization is conducted by applying an electric field to each of the two piezoelectric ceramic plates 2, 2. For the stacked element 5, the polarization is conducted by applying an electric field to the whole stacked body. For example, all piezoelectric ceramic layers are polarized through the whole stacked body so as to give the same direction of polarization by once heating the stacked body, and then, cooling it while applying the electric field.

In terms of the movement of the element by polarization, for the bimorph displacement element 3 as described above, one piezoelectric plate 2 is expanded and the other piezoelectric plate 2 is contracted to induce displacement by bending as a whole by application of voltage through the electrodes. In contrast, the stacked element 5 is displaced in the stacked direction and only make the movement of expansion and contraction in the height direction as shown in FIGS. 8(A), 8(B) and 8(C), and does not induce the displacement by bending as with the bimorph element.

Accordingly, when such a stacked element is used as a piezoelectric actuator, it can be surely used in its way for the application utilizing the displacement in the stacked direction, but can not be utilized as a bending type stacked element which is a stacked element and induces the displacement by bending as with the bimorph element. For example, when the piezoelectric actuator is used as a needle driving mechanism of a hosiery machine or a warp controlling mechanism of a loom as described later, it is preferred that the piezoelectric actuator is displaced by bending as with the bimorph element, thereby making it possible to select knitting needles or to control warps at high speed.

The piezoelectric actuators are described, for example, in Japanese Unexamined Patent Publication Nos. 60-211176, 61-15383, 55-104149 and 54-133124.

SUMMARY OF THE INVENTION

It is therefore an object of the present invention to provide a bending type stacked piezoelectric actuator which is displaceable by bending, said actuator being small in displacement, but having the advantages of remarkably rapid response speed, increased power of generation, high conversion efficiency and high resonance frequency, compared with a bimorph element, and particularly a piezoelectric actuator which can be suitably used in a textile machine, especially in a needle driving mechanism of a hosiery machine or in a warp controlling mechanism of a loom.

The above and other objects and novel features of the invention will become apparent from the whole description of this specification.

The present invention provides a stacked piezoelectric actuator displaceable by bending (hereinafter referred to as a thickness conversion stacked piezoelectric actuator) comprising a plurality of piezoelectric ceramic layers stacked on one surface of a core material, and a plurality of piezoelectric ceramic layers stacked on the other surface thereof, said piezoelectric ceramic layers stacked on both surfaces being gradually decreased in thickness outwardly from said core material.

The present invention further provides a stacked piezoelectric actuator displaceable by bending (hereinafter referred to as a piezoelectric constant conversion stacked piezoelectric actuator) comprising a plurality of piezoelectric ceramic layers stacked on one surface of a core material, and a plurality of piezoelectric ceramic layers stacked on the other surface thereof, said piezoelectric ceramic layers stacked on both surfaces being successively increased in piezoelectric constant $d_{31}$ from inner layers to outer layers.

Furthermore, the present invention provides a stacked piezoelectric actuator displaceable by bending (hereinafter referred to as a voltage conversion stacked piezoelectric actuator) comprising a plurality of piezoelectric ceramic layers stacked on one surface of a core material, and a plurality of piezoelectric ceramic layers stacked on the other surface thereof, said piezoelectric ceramic layers stacked on both surfaces being successively increased in applied voltage from inner layers to outer layers.

DESCRIPTION OF THE PREFERRED EMBODIMENTS

Embodiments of the present invention are described with reference to the drawings.

Figure 1A:
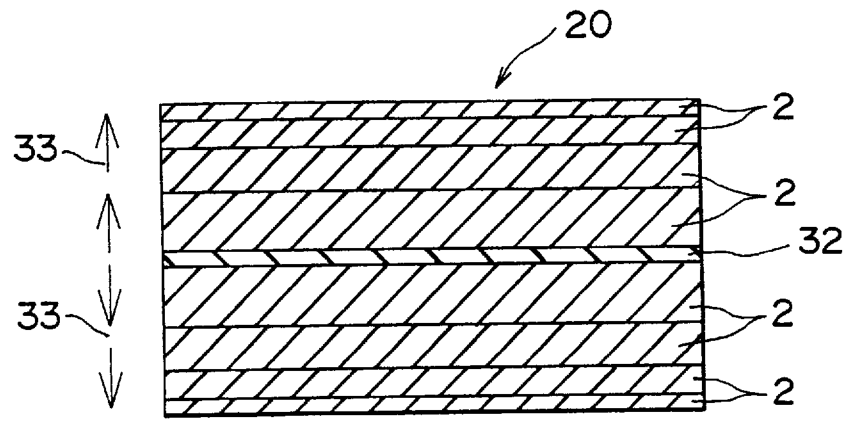
FIG. 1(A) is a cross sectional view showing a main part of a thickness conversion stacked piezoelectric actuator embodying the present invention.
Figure 1B:
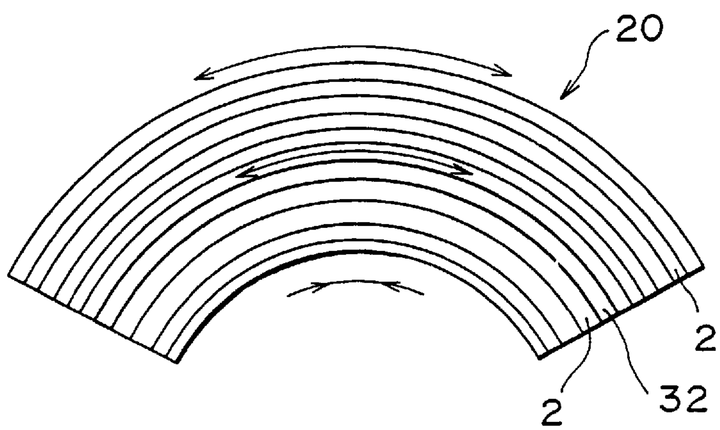
FIG. 1(B) is a schematic representation for illustrating the piezoelectric operation of the thickness conversion stacked piezoelectric actuator embodying the present invention.
Figure 1C:
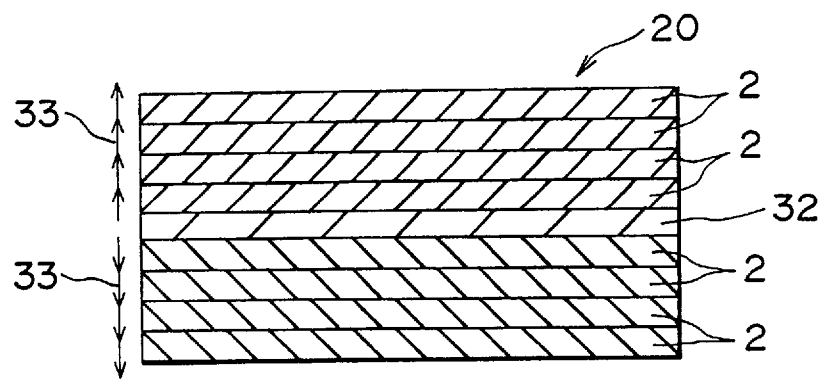
FIG. 1(C) is a cross sectional view showing a main part of another thickness conversion stacked piezoelectric actuator embodying the present invention.

FIG. 1(A) is a cross sectional view showing a main part of a thickness conversion stacked piezoelectric actuator embodying the present invention, FIG. 1(B) is a schematic representation for illustrating the piezoelectric operation of the thickness conversion stacked piezoelectric actuator embodying the present invention and FIG. 1(C) is a cross sectional view showing a main part of another thickness conversion stacked piezoelectric actuator embodying the present invention.

Figure 2:
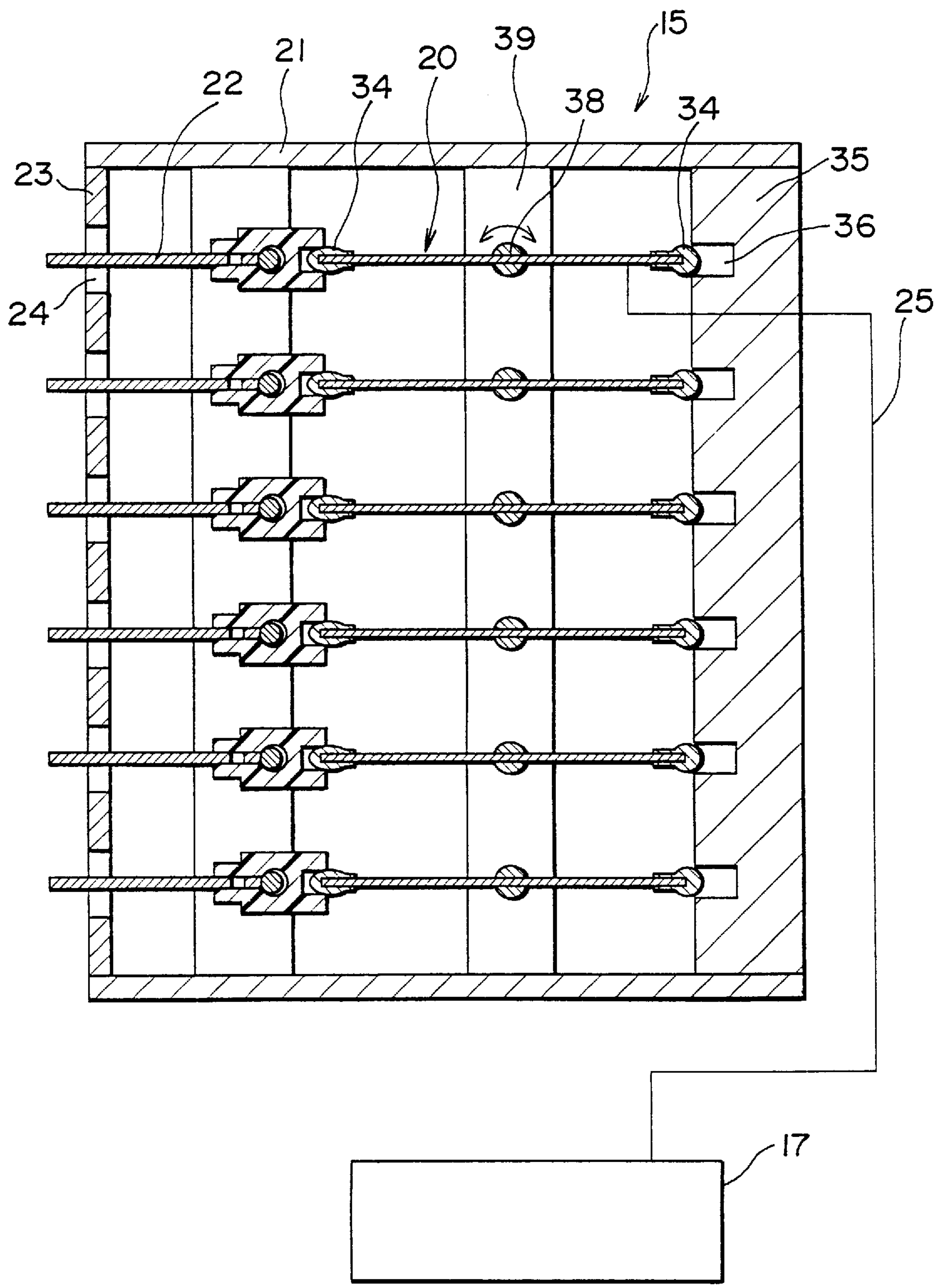
FIG. 2 is a cross sectional view showing a needle driving mechanism of a hosiery machine in which the piezoelectric actuator embodying the present invention is used.

FIG. 2 is a cross sectional view showing a needle driving mechanism of a hosiery machine in which the piezoelectric actuator embodying the present invention is used.

Figure 3A:
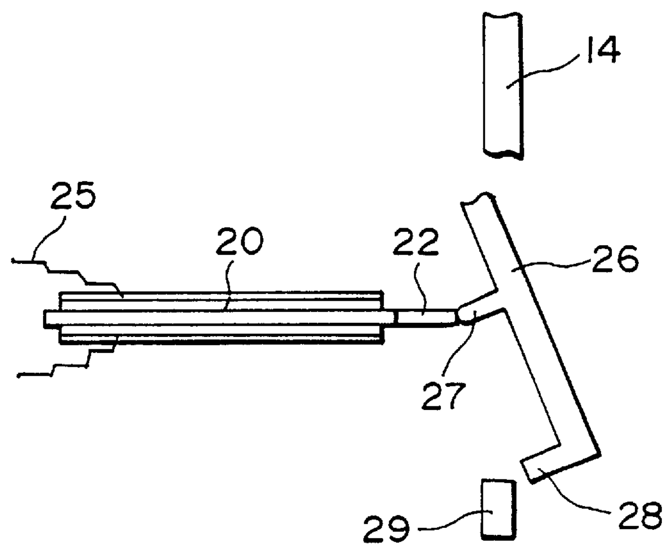
FIGS. 3(A) and 3(B) are each views for illustrating the needle driving operation of the piezoelectric actuator in the needle driving mechanism of the hosiery machine.
Figure 3B:
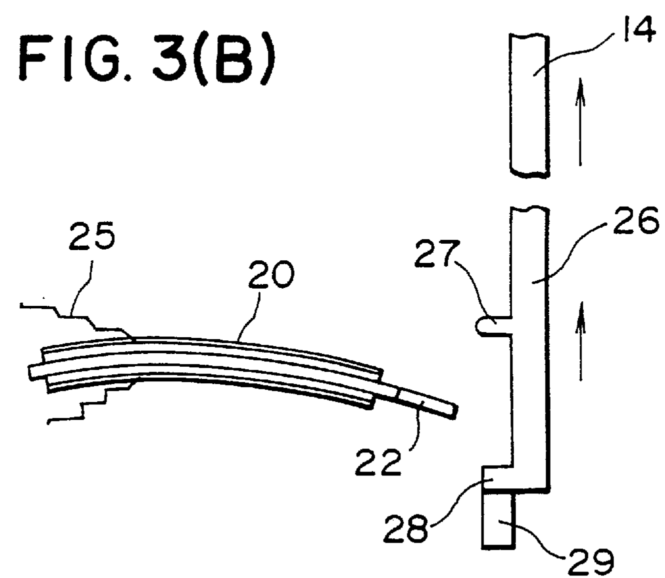

FIGS. 3(A) and 3(B) are each views for illustrating the needle driving operation of the piezoelectric actuator in the needle driving mechanism of the hosiery machine.

Figure 4:
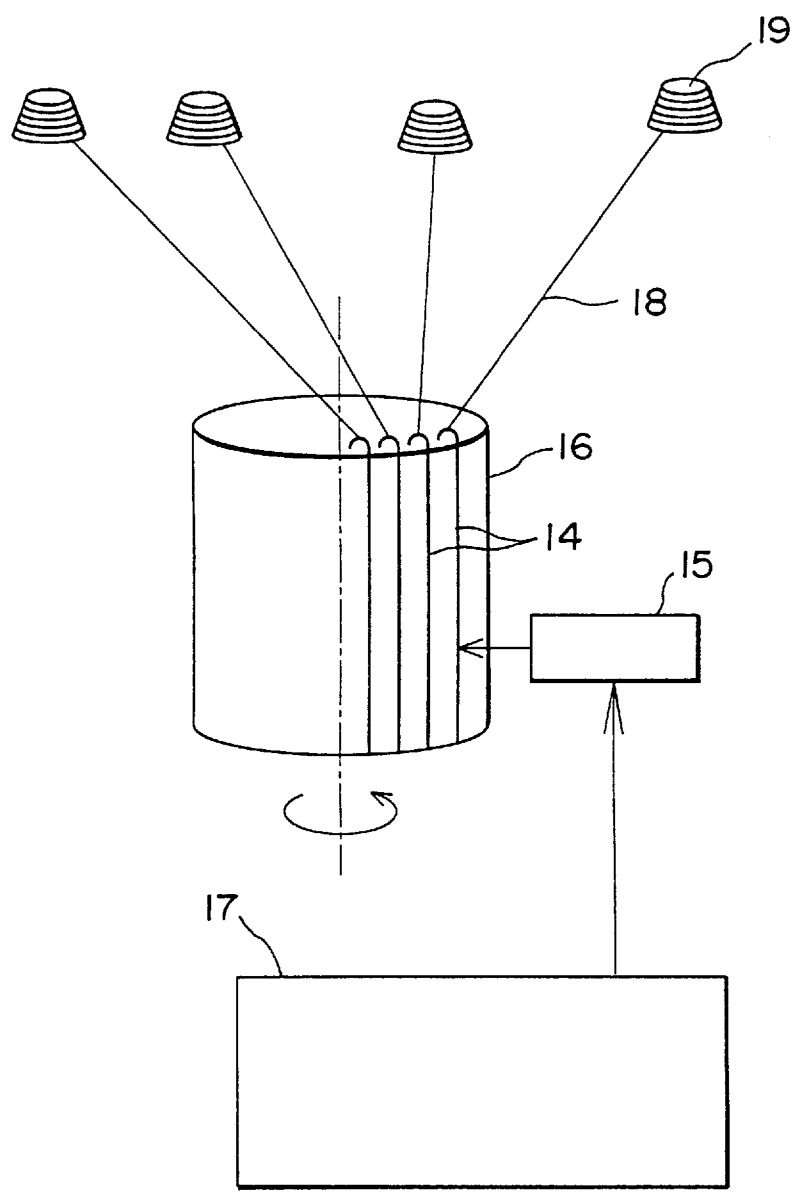
FIG. 4 is a schematic representation for illustrating a hosiery machine.

FIG. 4 is a schematic representation for illustrating as hosiery machine.

Figure 5A:
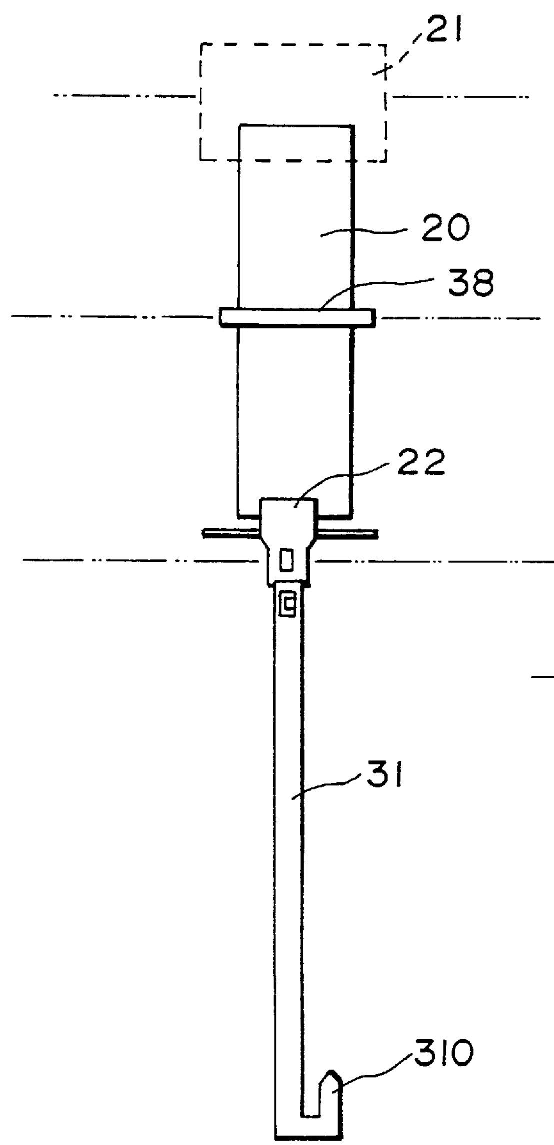
FIG. 5(A) is a plan view showing a warp controlling mechanism of a loom in which the piezoelectric actuator embodying the present invention is used.
Figure 5B:
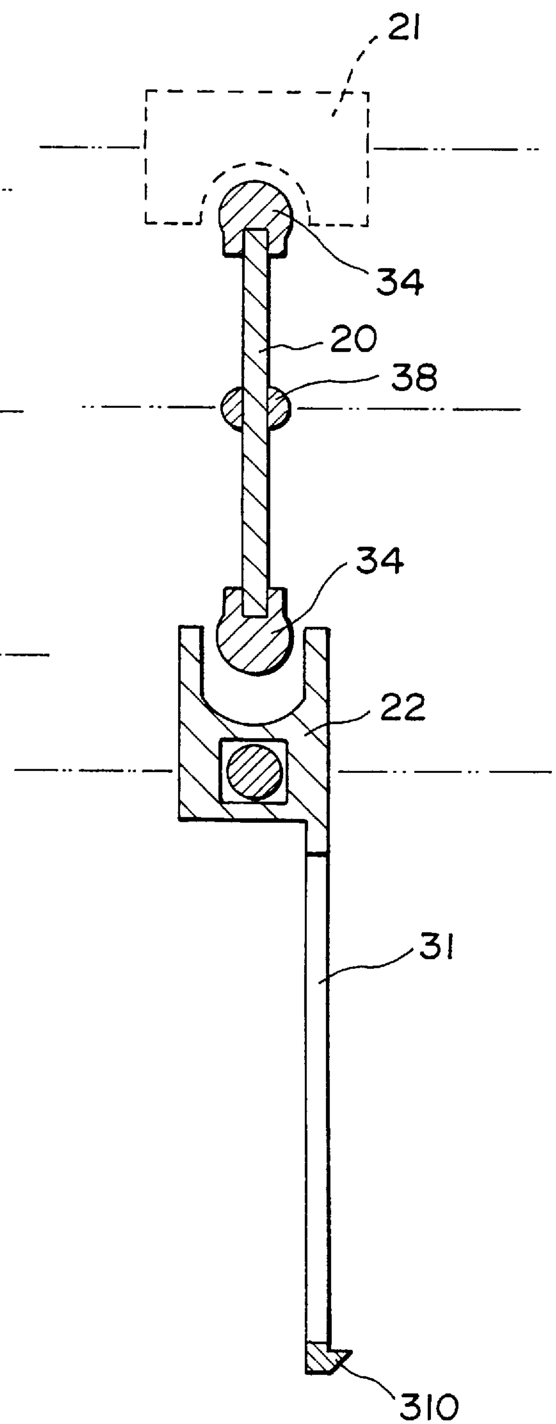
FIG. 5(B) is a cross sectional view of the warp controlling mechanism shown in FIG. 5(A)

FIG. 5(A) is a plan view showing a warp controlling mechanism of a loom in which the piezoelectric actuator embodying the present invention is used, and FIG. 5(B) is a cross sectional view of the warp controlling mechanism shown in FIG. 5(A).

Figures 6A, 6B:
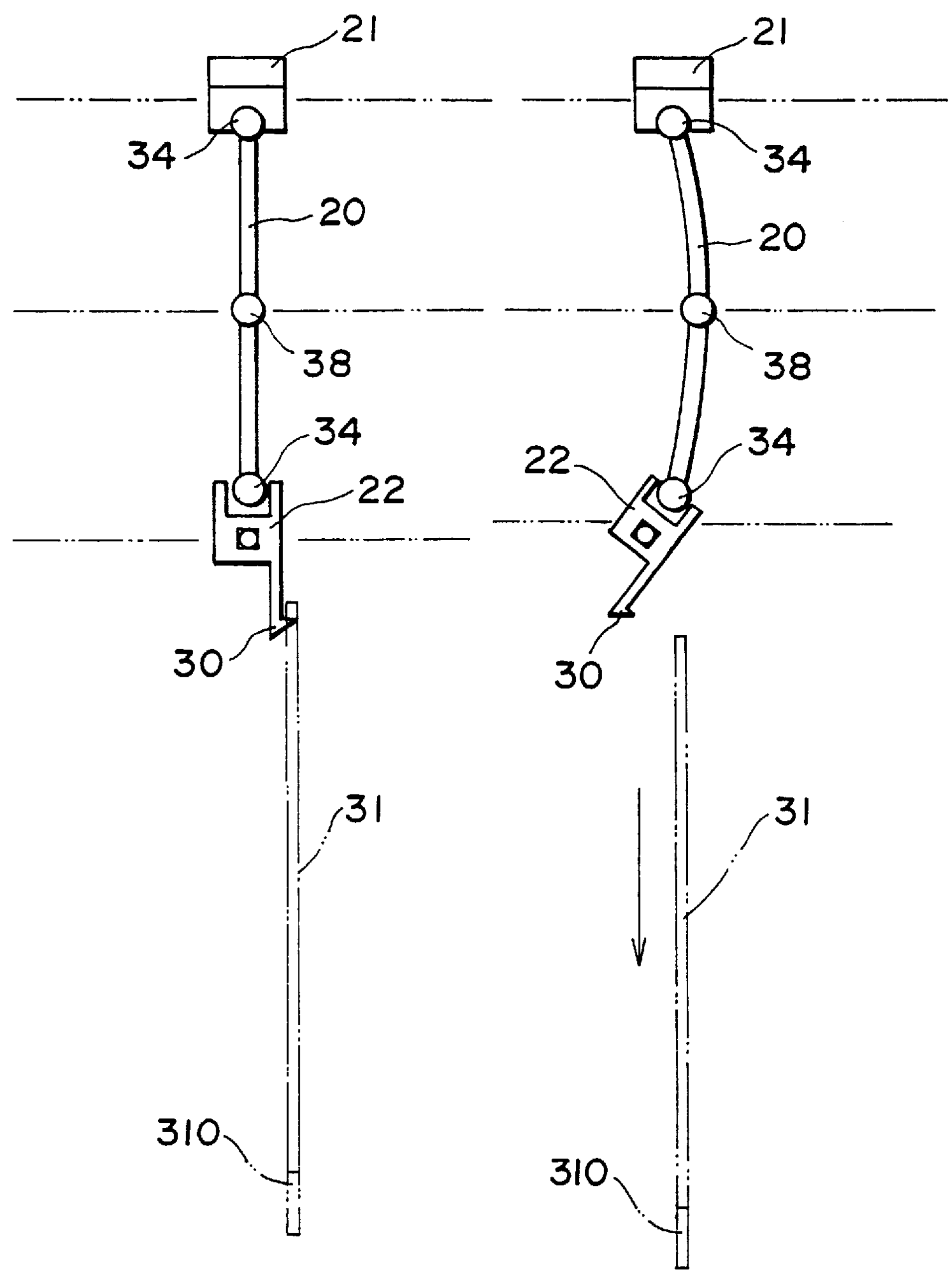
FIGS. 6(A) and 6(B) are each views for illustrating the controlling operation of the piezoelectric actuator in the warp controlling mechanism of the loom.
Figure 7A:
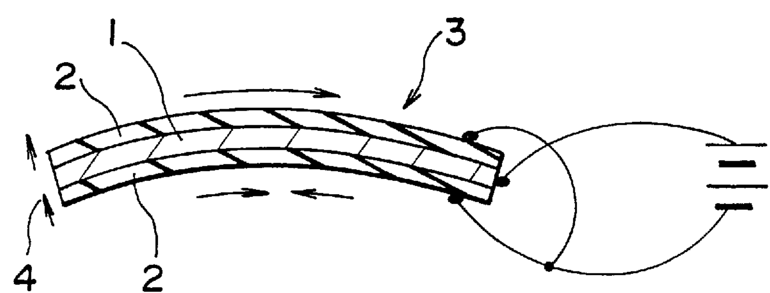
FIG. 7(A) is a schematic view showing a conventional bimorph piezoelectric element.
Figure 7B:
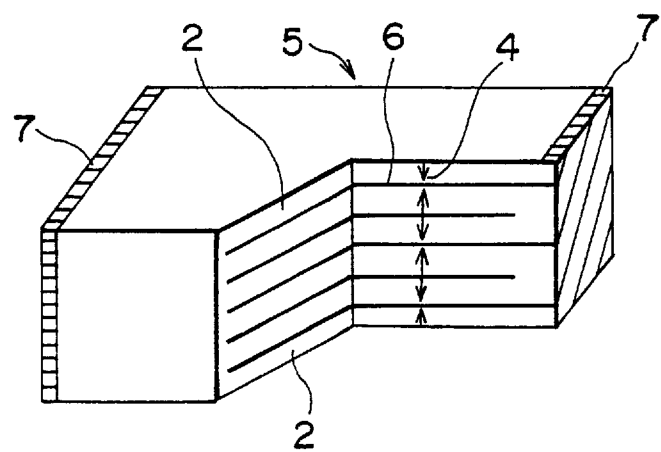
FIG. 7(B) is a schematic perspective view showing a conventional stacked piezoelectric element.
Figure 8A:
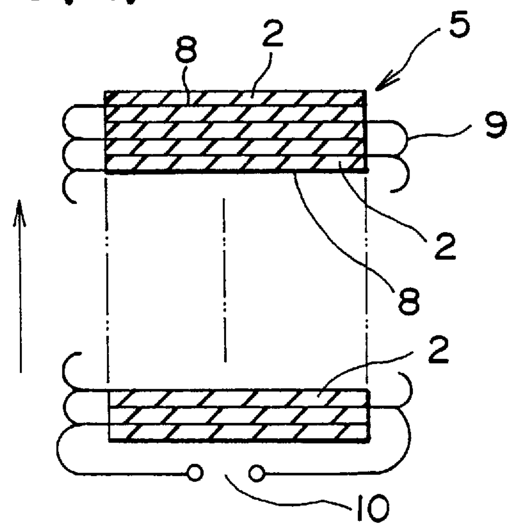
FIGS. 8(A), 8(B) and 8(C) are each schematic view showing conventional stacked piezoelectric elements.
Figure 8B:
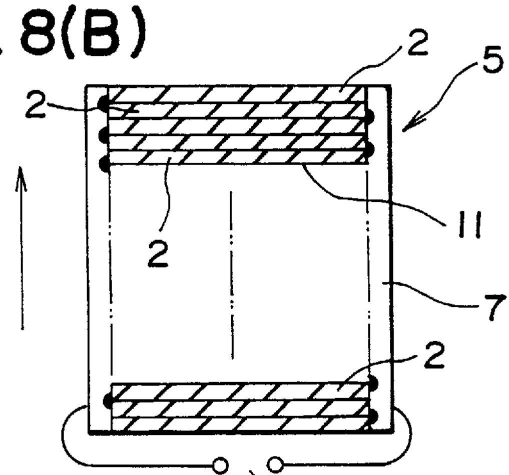
Figure 8C:
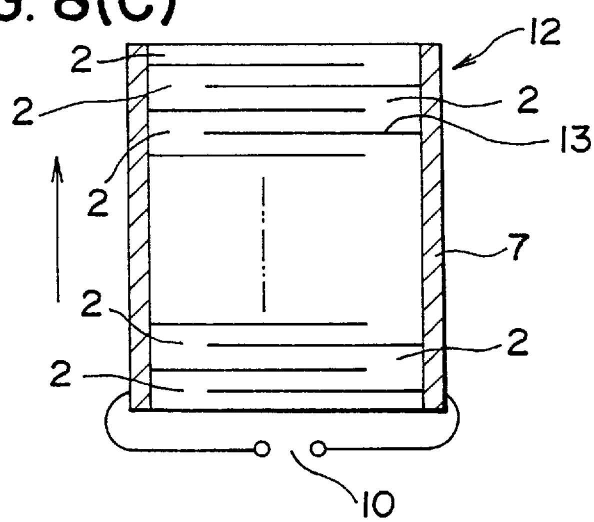

FIGS. 6(A) and 6(B) are each views for illustrating the controlling operation of the piezoelectric actuator in the warp controlling mechanism of the loom.

As shown in FIG. 4, in a hosiery jacquard knitting machine such as a jacquard circular knitting machine or a jacquard flat knitting machine, a needle driving mechanism (needle driving piezoelectric actuator) is used for transmitting a patterning procedure memorized in a memory such as a floppy disk to an up-and-down movement of knitting needles. A number of needle driving mechanisms 15 governing the up-and-down movement of the knitting needles 14 are disposed around a knitting cylinder 16, and connected to a patterning controller 17. The patterning procedure is supplied from the patterning controller 17 to make the up-and-down movement of the knitting needles 14, thereby conducting jacquard knitting of a hosiery. Although not shown in the drawing, a number of needle driving jacks having protruded butts are disposed under the knitting needles, and the knitting needles are brought into abutting contact with upper portions of the jacks. Knitting yarns 18 are supplied from bobbins 19 to the knitting cylinder 16, and the needle driving mechanisms 15 are allowed to act on the needle driving jacks to make the up-and-down movement of the knitting needles 14 as described above, thereby conducting jacquard knitting of the hosiery. The needle driving mechanisms 15 may be allowed to act on the knitting needles 14 directly.

In one embodiment of the needle driving mechanism 15, as shown in FIG. 2, piezoelectric actuators 20 are supported by a support (housing) 21 in multiple stages, and fingers 22 are connected to ends of the piezoelectric actuators 20. Leading ends of the fingers 22 are protruded outward through openings 24 of a stopper 23 of the support 21, and each of the piezoelectric actuators 20 is allowed to operate through a lead wire 25 by the patterning controller 17. Further, operation of the fingers 22 makes the up-and-down movement of the knitting needles 14 as described above, thereby conducting jacquard knitting of the hosiery.

An example of the needle driving operation is described for the piezoelectric press system. As shown in FIG. 3(B), application of voltage from the patterning controller 17 to the piezoelectric actuator 20 through the lead wire 25 (or application of a positive pulse) bends the piezoelectric actuator 20 to deflect the finger 22, for example, downward, which causes no pressing of the finger against the butt 27 of the needle driving jack 26. Accordingly, the needle driving jack 26 keeps the vertical position. As a result, the butt 28 for a lifting cam protruded at a lower end of the needle driving jack 26 comes into engagement with the lifting cam 29 to cause the needle driving jack 16 and the knitting needle 14 brought into abutting contact with an upper portion thereof to move upward, resulting in formation of a knitted loop with the knitting needle 14. On the other hand, as shown in FIG. 3(A), no application of voltage (or application of a negative pulse) leads to no bending of the piezoelectric actuator 20, so that the butt 27 of the needle driving jack 26 is pressed. As a result, the butt 28 for the lifting cam protruded at the lower end of the needle driving jack 26 does not come into engagement with the lifting cam 29 to give no knitting operation to the knitting needle 14 brought into abutting contact with the upper portion of the needle driving jack 26.

Then, a piezoelectric actuator used in a warp controlling mechanism of a loom is described according to FIGS. 5 and 6.

With respect to the general principle of the loom, in the case of a plain weave, warp yarns are passed through heddles, and divided into two groups by the up-and-down movement of the heddles to form a shedding. Then, a weft yarn is passed through the shedding with a shuttle, and pressed to a cloth fell. Thereafter, another combination of the warp yarns is formed, followed by passing of the weft yarn, thus advancing weaving.

The piezoelectric actuator is used for control of the heddles and control of the warp yarns as well.

As shown in FIGS. 5 and 6, a finger 22 is attached to an end of a piezoelectric actuator 20, which is electrically connected to a heddle controlling mechanism although not shown in the drawings, and the piezoelectric actuator 20 is operated to control heddles (not shown in the drawings) connected to a lower portion of a controlling rod 31, and warp yarns as well by operation of the finger 22. When voltage (pulse) is applied to the piezoelectric actuator 20, the piezoelectric actuator 20 is displaced by bending, and the finger 22 also moves following the displacement by bending (bending movement) of the piezoelectric actuator 20, because of connection of the finger 22 to the piezoelectric actuator 20. The finger 22 which is provided with a hook 30 (or a hook hole) comes into engagement with the controlling rod 31 which is similarly provided with a hook or a hole 310. On the other hand, when voltage (pulse) is not applied to the piezoelectric actuator 20, the finger 22 does not come into engagement with the controlling rod 31, and keeps a position apart therefrom. Thus, the finger 22 can selectively come into engagement with and maintain the controlling rod 31. As described above, the controlling rod 31 is connected to the heddles at a lower portion of the hook or the hole 310 although not shown in the drawings. The controlling rod 31 operatively associates with the heddles to control the heddles and to control the warp yarns.

Thickness Conversion Stacked Piezoelectric Actuator

The stacked piezoelectric actuator can be used as the piezoelectric actuator 20 in the textile machine as described above.

As shown in FIG. 1(A), the piezoelectric actuator (thickness conversion stacked piezoelectric actuator) 20 is a stacked type. A plurality of piezoelectric ceramic layers 2, . . . are stacked on one surface of a core material 32, and a plurality of piezoelectric ceramic layers 2, . . . are stacked on the other surface thereof. The piezoelectric ceramic layers 2, . . . stacked on both surfaces are gradually decreased in thickness outwardly from the core material 32.

It is necessary to gradually decrease the thickness of the piezoelectric ceramic layers 2, . . . stacked on both surfaces of the core material 32, outwardly from the core material 32, as shown in the drawing. As seen from FIGS. 1(A) and 1(B), the piezoelectric ceramic layers 2, . . . stacked on the upper side of the core material 32 are gradually decreased in thickness successively from a lower layer to a an upper layer. On the other hand, the piezoelectric ceramic layers 2, . . . stacked on the lower side of the core material 32 are gradually decreased in thickness successively from an upper layer to a lower layer. When the stacked body is seen as a whole; the lowermost layer side becomes the innermost side layer in the drawings. Accordingly, the piezoelectric ceramic layers 2, . . . stacked on one side of the core material 32 are gradually decreased in thickness successively from an inner layer to an outer layer, whereas the piezoelectric ceramic layers 2, . . . stacked on the other side of the core material 32 are gradually decreased in thickness successively from an outer layer to an inner layer.

In the above-mentioned case, if the thickness of the piezoelectric ceramic layer 2 tangent to the core material 32 is t, the thickness of the piezoelectric ceramic layer 2 disposed outside it is $t\text{-}x_1$, and then, the thickness is successively decreased as $t\text{-}x_2$, $t\text{-}x_3$, . . . $t\text{-}x_n$ ($x_1<x_2<x_3<x_n$).

As piezoelectric substances (crystals) constituting the above-mentioned piezoelectric ceramic layers 2, various piezoelectric substances (crystals) can be used. Specific examples thereof include solid solutions of lead zirconate ($PbZrO_3$) and lead titanate ($PbTiO_3$), which are called PZT, lead zirconate ($PbZrO_3$), lead titanate ($PbTiO_3$),barium titanate ($BaTiO_3$) and barium phosphate. Additives such as Nb, Co and Mn can be added to the piezoelectric substances. The piezoelectric substances may be complexes thereof with polymers.

Examples of the core materials 32 include ceramics and metallic materials. As the core materials 32, the above-mentioned piezoelectric substances are preferably used. That is, the core materials are preferably the same materials as the ceramics constituting the piezoelectric ceramic layers 2, . . . stacked thereon. Use of the same materials results in matching of the coefficients of thermal expansion to prevent separation in the interfaces of the core materials 32 and the piezoelectric ceramic layers 2.

Piezoelectric Constant Conversion Stacked Piezoelectric Actuator

In another embodiment, the stacked piezoelectric actuator of the present invention is formed as a piezoelectric constant conversion stacked piezoelectric actuator, and piezoelectric ceramic layers 2, . . . stacked on both surfaces of a core material 32 are successively increased in piezoelectric constant $d_{31}$ from inner layers to outer layers. In this case, layers close to the core material 32 are taken as the inner layers on both sides.

Similarly to the above-mentioned embodiment, this provides a stacked piezoelectric actuator displaceable by bending.

The above-mentioned piezoelectric constant $d_{31}$ is described. This is based on the piezoelectric constant (piezoelectric strain constant) in evaluation and measurement of piezoelectric ceramics.

Although there are various fundamental equations for describing piezoelectric phenomena, the d form is employed as described above in the present invention. In the d form for determining the material constant in the piezoelectric ceramic, a mechanical variation (S: strain) and a electrical variation (electric displacement: D) are represented by the following equation (1):

Fundamental Equation $$S=s^{E}T+dE$$

$$D=dT+\epsilon^{T}E \quad (1)$$

wherein D and E represent the vector quantities, assuming that the piezoelectric ceramic has high symmetry in its crystalline structure; T and S represent the symmetrical tensor quantities; d represents the piezoelectric strain constant; $s^E$ represents the elastic compliance at E=0; and $\epsilon^T$ represents the dielectric constant at T=0.

In coefficient matrixes according to these vector quantities D and E and symmetrical tensor quantities T and S, one of independent coefficients which are not 0 is the $d_{31}$ coefficient.

Evaluating and measuring methods according to the so-called resonance methods treating piezoelectric bodies as resonators are established as IEEE Standards 176-1978 in U.S.A., as Electronic Material Industries Association Standards EMAS-6001-6006 in Japan, and internationally as IEC Standard Publication 483, 1st edition.

The piezoelectric coefficient $d_{31}$ is derived from the following equation (2):

$$d_{31}=\kappa_{31}\sqrt{\epsilon_{33}^{T}\cdot s_{11}^{E}} \quad (2)$$

wherein k is the electromechanical coupling coefficient, the length vibration of a rectangular plate is taken as $k_{31}$, and the unit of the piezoelectric coefficient $d_{31}$ is C/N (m/V).

The piezoelectric coefficient $d_{33}$ in the longitudinal vibration of a column determined by the following equation (3) is a value for the whole stacked layers, and in the present invention, it is necessary that the piezoelectric coefficient $d_{31}$ for each of the stacked piezoelectric ceramic layers satisfies the above-mentioned equation.

$$d_{33}=\kappa_{33}\sqrt{\epsilon_{33}^{T}\cdot s_{33}^{E}} \quad (3)$$

wherein k is the electromechanical coupling coefficient, and the longitudinal vibration of a column is taken as $k_{33}$.

The piezoelectric coefficient $d_{31}$ for each of the stacked piezoelectric ceramic layers can be adjusted by suitably selecting composition and materials such as solid solutions of lead zirconate ($PbZrO_3$) and lead titanate ($PbTiO_3$), which are called PZT, lead zirconate ($PbZrO_3$), lead titanate ($PbTiO_3$),barium titanate ($BaTiO_3$) and barium phosphate.

Voltage Conversion Stacked Piezoelectric Actuator

In still another embodiment, the stacked piezoelectric actuator of the present invention is formed as a voltage conversion stacked piezoelectric actuator, and the voltage applied to piezoelectric ceramic layers 2, . . . stacked on both surfaces of a core material 32 are successively increased from inner layers to outer layers. In this case, layers close to the core material 32 are taken as the inner layers on both sides.

Similarly to the above-mentioned embodiments, this provides a stacked piezoelectric actuator displaceable by bending.

In order to obtain the stacked piezoelectric actuator displaceable by bending, it is preferred that the core material 32 used in the present invention is not polarized and is a non-polarized, piezoelectrically inactive layer.

The piezoelectric constant conversion stacked piezoelectric actuator and the voltage conversion stacked piezoelectric actuator in the present invention can be applied to a stacked piezoelectric actuator having piezoelectric ceramic layers 2, . . . of the same thickness as shown in FIG. 1(C) to obtain a stacked piezoelectric actuator displaceable by bending. However, use thereof in combination with thickness conversion can provide a more preferred stacked piezoelectric actuator displaceable by bending. Further, when the core material 32 is the non-polarized, piezoelectrically inactive layer as described above and the polarization form 33 of each of the piezoelectric ceramic layers 2, . . . is reverse polarization as described below, a further more preferred stacked piezoelectric actuator displaceable by bending can be obtained.

In order to obtain a stacked piezoelectric actuator more displaceable by bending, the plurality of piezoelectric ceramic layers 2, . . . stacked on one surface of the core material 32 and the plurality of piezoelectric ceramic layers 2, . . . stacked on the other surface thereof are reversely polarized in each polarization form 33, for example, as shown in FIG. 1(C).

The stacked piezoelectric actuator according to the present invention can be obtained, for example, in the following manner.

An organic solvent, a binder, a plasticizer, a dispersing agent and the like are added to a calcined powder of a piezoelectric ceramic, followed by mixing. Then, the resulting mixture was formed to a green sheet, which is stamped out to an appropriate size. A conductive paste for internal electrodes comprising Ag-Pd or Pd is screen printed, and required numbers of these green sheets are stacked and press formed to integrate them. The green sheets are heated (usually at 500° C. to 600° C.) with a press, followed by burning, for example, at about 1200° C. to obtain a stacked ceramic product. After cutting of the stacked product, insulators and external electrodes are attached thereto. The internal electrodes are electrically connected for every other layer in parallel. In addition, for the production of the stacked piezoelectric actuator, the above-mentioned technique of the stacked ceramic condenser called the green sheet method can be used.

The resulting stacked product is polarized for utilizing its piezoelectricity. The polarization can be performed, for example, in air or in silicone oil. The electric field cooling method may be used in which after once heated to the Curie point or more, the stacked product is gradually cooled while applying the electric field.

In this case, it is preferred that the plurality of piezoelectric ceramic layers 2, . . . stacked on one surface of the core material 32 and the plurality of piezoelectric ceramic layers 2, . . . stacked on the other surface thereof are reversely polarized in each polarization form 33.

Further, in this case, it is preferred that the core material 32 is not polarized, and is the non-polarized, piezoelectrically inactive layer.

Although the above-mentioned bending type stacked piezoelectric actuator may be produced by integrating the sheets with an adhesive, it is preferably formed of the same material as a whole without use of the adhesive by integrating them with the conductive paste for internal electrodes allowed to exist therein as described above.

The drawbacks can be avoided thereby that the actuator produced by adhesion of the two piezoelectric ceramic sheets different from each other in the properties of expansion and contraction to the metal shim member by use of the adhesive, such as the bimorph element, is separated in the interfaces thereof, and that further addition of the adhesion step results in increased cost. Integration of the same material without use of the adhesive can improve the adhesive strength, omit the adhesion step, and reduce cost. Moreover, use of the same material can match the coefficients of thermal expansion. In this respect, the adhesive strength is also improved, and it is unnecessary to prepare different metallic materials in the production.

When the piezoelectric actuator 20 of the present invention is used in the warp controlling mechanism of the loom or the needle driving mechanism of the hosiery machine as described above, it preferably takes such a form as does not prevent the bending movement thereof, as described in the above-mentioned embodiments.

Taking, as an example, the needle driving mechanism 15 of the hosiery machine, a spherical body 34 is attached to a rear end of the piezoelectric actuator 20, and the rear end of the piezoelectric actuator 20 to which the spherical body 34 is attached is inserted in a groove 36 of a piezoelectric actuator fitting portion 35 of the support 21. A spherical portion of the spherical body 34 is made movable in the groove 36 of the piezoelectric actuator fitting portion 35, thereby making the rear end of the piezoelectric actuator 20 movable.

Further, a spherical body 34 similar to the above is also attached to a leading end of the piezoelectric actuator 20. The spherical body 34 is made movable in a rear end of the finger 22, thereby also making the leading end of the piezoelectric actuator 20 movable.

Furthermore, a rotative body 38 is fixedly attached to an intermediate position between the rear end and the leading end of the piezoelectric actuator 20, and both ends of the rotative body 38 are rotatably mounted on a rotative body fitting portion (intermediate fulcrum portion) 39 of the support 21 so that the movement of the intermediate position between the rear end and the leading end of the piezoelectric actuator 20 is not stopped with the rotation of the rotative body 38.

According to this system and apparatus, the piezoelectric actuator 20 is freely moved, its movement is not prevented, and the intermediate fulcrum is formed. It has therefore the excellent advantages that the needle driving speed can be remarkably increased, and that the life of the piezoelectric actuator 20 is prolonged.

In this respect, the piezoelectric actuator is also similarly used in the warp controlling mechanism of the loom. A spherical body 34 is attached to an upper end of the piezoelectric actuator 20 and movably supported in a groove 36 formed in the support (controlling rod support) 21, and a lower end thereof is movably connected to the finger 22. An intermediate position between the upper end and the lower end of the piezoelectric actuator 20 is fixed to a rotative body 38 rotatably mounted on the controlling rod support 21, and the upper end and the lower end of the piezoelectric actuator 20 and the intermediate position therebetween are made movable following the bending movement of the piezoelectric actuator 20 so as not to prevent the bending movement of the piezoelectric actuator 20. This can provide the advantages that the speeds of the controlling operation of a controlling rod 31, the heddles and the selection controlling operation of warp yarns can be increased, that the life of the piezoelectric actuator 20 is prolonged, and that the applied voltage can be more reduced.

Although the specific embodiments of the invention have been described, it is to be understood of course that these embodiments are not intended to limit the scope of the invention and that various changes and modifications can be made in the invention without departing from the spirit and scope thereof.

The warp controlling mechanisms of the looms using the piezoelectric actuators of the present invention are mainly used in jacquard machines in which cards perforated according to jacquard patterns proposed by Jacquard are used to pull up only hooks at positions corresponding to holes of the cards, thereby pulling up only warp yarns connected to the hooks through harness cords, and sheds are formed between the warp yarns pulled up and warp yarns remained at original positions.

The present invention can also be applied as piezoelectric actuators of the scooping-up system instead of the above-mentioned actuators of the press system in the needle driving mechanisms of the hosiery machines.

In the above-mentioned embodiments, the piezoelectric actuators of the present invention are applied to the textile machines. However, the present invention can also be applied to piezoelectric actuators in various fields other than the textile machines. For example, the piezoelectric actuators of the present invention can be used in various fields including positioners (positioning devices), printer heads, ultrasonic motors, piezoelectric relays, piezoelectric valves, electronic computers and related equipment thereof (personal computers and printers), electronic equipment for civil use (televisions, radios and video tape recorders), business equipment (copying machines and typewriters), office supplies and precision instruments (cameras and watches).

The effects obtained by the typical embodiments of the piezoelectric actuators of the invention disclosed in this application are briefly described as below.

That is, according to the present invention, the bending type stacked piezoelectric actuators which are displaceable by bending, said actuators being small in displacement, but having the advantages of remarkably rapid response speed, increased power of generation, high conversion efficiency and high resonance frequency, compared with the bimorph elements, and particularly the piezoelectric actuators which can be suitably used in the textile machines, especially in the needle driving mechanisms of the hosiery machines or in the warp controlling mechanisms of the looms.

We claim:

1. A stacked piezoelectric actuator displaceable by bending comprising a plurality of piezoelectric ceramic layers stacked on one surface of a core material, and a plurality of piezoelectric ceramic layers stacked on the other surface thereof, said piezoelectric ceramic layers stacked on both surfaces being successively increased in piezoelectric constant $d_{31}$ from inner layers to outer layers.

2. A stacked piezoelectric actuator according to claim 1, in which said core material is formed of a non-polarized, piezoelectrically inactive layer.

3. A stacked piezoelectric actuator according to claim 2, in which said core material is formed of a ceramic.

4. A stacked piezoelectric actuator according to claim 2, in which said core material is formed of a metal.

5. A stacked piezoelectric actuator according to claim 1, in which the plurality of piezoelectric ceramic layers stacked on one of the surfaces of the core material are reversely polarized relative to the plurality of layers stacked on the other side of the core material.

6. A stacked piezoelectric actuator according to claim 1, in which said stacked piezoelectric actuator is a stacked piezoelectric actuator for a textile machine.

7. A stacked piezoelectric actuator according to claim 6, in which said stacked piezoelectric actuator is a stacked piezoelectric actuator in a needle driving mechanism of a hosiery machine.

8. A stacked piezoelectric actuator according to claim 6, in which said stacked piezoelectric actuator is a stacked piezoelectric actuator in a warp controlling mechanism of a loom.

* * * * *